US007958746B2

(12) United States Patent
Seneschal-Merz et al.

(10) Patent No.: US 7,958,746 B2
(45) Date of Patent: Jun. 14, 2011

(54) METHOD FOR PRODUCING A GLASS CERAMIC HAVING A GARNET PHASE

(75) Inventors: Karine Seneschal-Merz, Mainz (DE); Bernd Hoppe, Ingelheim (DE); Dirk Sprenger, Stadecken-Elsheim (DE); Friedrich Siebers, Nierstein (DE); Martin Letz, Mainz (DE); Thilo Zachau, Buerstadt-Riedrode (DE)

(73) Assignee: Schott AG, Mainz (DE)

( * ) Notice: Subject to any disclaimer, the term of this patent is extended or adjusted under 35 U.S.C. 154(b) by 815 days.

(21) Appl. No.: 11/757,609

(22) Filed: Jun. 4, 2007

(65) Prior Publication Data
US 2008/0041106 A1  Feb. 21, 2008

(30) Foreign Application Priority Data
Jun. 6, 2006 (DE) .......................... 10 2006 027 306

(51) Int. Cl.
*C03C 10/00* (2006.01)
(52) U.S. Cl. ................................ 65/33.2; 65/33.1; 501/2
(58) Field of Classification Search .................... 51/307, 51/309, 298, 295, 308; 501/127, 128, 2, 501/32, 153, 53; 65/162, 374.1, 33.1, 33.2, 65/33.3, 33.4
See application file for complete search history.

(56) References Cited

U.S. PATENT DOCUMENTS

| | | | | |
|---|---|---|---|---|
| 3,809,543 A | * | 5/1974 | Gaskell et al. | 65/33.8 |
| 4,740,403 A | * | 4/1988 | Oomen et al. | 428/34.4 |
| 4,794,094 A | | 12/1988 | Makishima et al. | |
| 6,197,429 B1 | * | 3/2001 | Lapp et al. | 428/450 |
| 6,429,583 B1 | | 8/2002 | Levinson et al. | |
| 6,791,259 B1 | | 9/2004 | Stokes et al. | |
| 6,843,073 B2 | | 1/2005 | Fotheringham et al. | |
| 2002/0062662 A1 | | 5/2002 | Fotheringham et al. | |

(Continued)

FOREIGN PATENT DOCUMENTS

| | | | |
|---|---|---|---|
| DE | 102004048041.9 | * | 10/2004 |
| DE | 102004048041 | * | 6/2006 |
| EP | 1 245 548 A1 | | 10/2002 |
| EP | 1 642 869 A1 | | 4/2006 |

(Continued)

OTHER PUBLICATIONS

Shunsuke Fujita et al., YAG glass-ceramic phosphor for white LED (I): background and development, Sep. 2004, vol. 65th, No. 3, p. 1286.

*Primary Examiner* — Matthew J Daniels
*Assistant Examiner* — Yana Belyaev
(74) *Attorney, Agent, or Firm* — Harness, Dickey & Pierce, P.L.C.

(57) ABSTRACT

The invention proposes a method for producing glass ceramics which is particularly well suited as light conversion material, especially for down conversion. One initially produces a starting glass, containing (on an oxide basis) 5-50% by weight of $SiO_2$, 5-50% by weight of $Al_2O_3$ and 10-80% by weight of at least one oxide selected from the from the group formed by $Y_2O_3$, $Lu_2O_3$, $Sc_2O_3$, $Gd_2O_3$, $Yb_2O_3$, $Ce_2O_3$, as well as 0.1-30% by weight of at least one oxide selected from the group formed by $B_2O_3$, $Th_2O_3$, and oxides of the lanthanoids, except $Lu_2O_3$, $Gd_2O_3$, $Yb_2O_3$, $Ce_2O_3$. Thereafter, the material is heated up for ceramization at a heating rate of at least 100 K/min to a temperature in the range of between 1000° C. to 1400° C. until crystallites are formed that contain a garnet phase. Thereafter, the material is cooled down to room temperature. Alternatively, controlled cooling-down from the molten state is possible.

13 Claims, 3 Drawing Sheets

100 µm

U.S. PATENT DOCUMENTS

| | | | |
|---|---|---|---|
| 2003/0000151 A1* | 1/2003 | Rosenflanz et al. | 51/309 |
| 2003/0025449 A1 | 2/2003 | Rossner | |
| 2003/0073563 A1 | 4/2003 | Brodkin et al. | |
| 2004/0148870 A1* | 8/2004 | Celikkaya et al. | 51/309 |
| 2005/0103056 A1* | 5/2005 | Fotheringham et al. | 65/162 |
| 2006/0181196 A1* | 8/2006 | Peuchert et al. | 313/501 |

FOREIGN PATENT DOCUMENTS

| | | |
|---|---|---|
| FR | 2 814 457 | 3/2002 |
| JP | 4-119941 | 4/1992 |
| JP | 2002-173337 | 6/2002 |
| JP | 2002-531955 | 9/2002 |
| JP | 2005-29431 | 2/2005 |

\* cited by examiner

US 7,958,746 B2

METHOD FOR PRODUCING A GLASS CERAMIC HAVING A GARNET PHASE

RELATED APPLICATIONS

This application claims priority of German Patent Application 10 2006 027 306.0 filed on Jun. 6, 2006, the contents of which is fully incorporated by reference.

BACKGROUND OF THE INVENTION

The present invention relates to a method for producing a glass ceramic having a garnet phase and to an advantageous application of such glass ceramic.

Recently, LEDs have been employed to an increasing degree for lighting purposes because they offer a number of advantageous properties including, for example, high efficiency due to direct conversion of electric energy to light energy, and high compactness.

However, until a few years ago LEDs were employed in "low-emitting" applications only, especially for indication purposes. The high potential of LEDs for applications with high light demand was discovered only recently when increased efforts were made to achieve improved energy input coupling and improved heat management.

LEDs produce light in a very narrow spectral band, while in most of the cases white light is required for illumination purposes. Commercially available white LEDs use a III-V semiconductor emitter for stimulating a luminescent material that emits a secondary wavelength in a lower wavelength band (down conversion). One known solution uses a blue InGaN/GaN LED for stimulating YAG:Ce, a broadband yellow luminescent material. With these LEDs, that have been converted using a luminescent material, a given proportion of the emitted blue light passes the luminescent layer covering the LED chip so that the overall spectrum obtained assumes a color very close to white light. Due to the absence of spectral portions in the blue/green band and in the red wavelength band, the resulting color is, however, not satisfactory in most of the cases.

US 2003/0025449 A1 discloses a hybrid LED comprising a radiation-emitting semiconductor body (chip) which is in direct contact, via an optical coupling agent, with a glass ceramic body that serves as a conversion agent. The glass ceramic body contains crystallites of the garnet type doped with rare earths (such as YAG:CE), thiogalate or chlorosilicate as luminescent material. The starting glasses from which such glass ceramics are produced consist of silicate glasses or borate glasses. The luminescent glass ceramic is produced by mixing a glass frit with a suitable proportion of a luminescent material in powder form, and the mixture is molten, then cast and molded to achieve the desired shape. It is possible in this way, from the very beginning, to produce a glass ceramic body in the desired shape, advantageous for the intended application, for example in the form of a lens.

However, that document does not disclose the way in which to produce such a luminescent glass ceramic having a garnet phase, with properties as advantageous as possible. Rather, the document merely relates to the melting technology used for production in a general way.

Another lighting source using an LED that emits blue light has been known from U.S. Pat. No. 6,791,259 B1. For producing white light, a phosphorous that emits yellow light, such as YAG:Ce or ZnS:Mn, is used, distributed in an epoxy resin or silicon layer or in a glass layer. In addition, a layer with radiation-diffusing particles is provided, which contains particles of $BaTiO_3$, $Al_2O_3$, $SiO_2$, $CaCO_3$ or $BaSO_4$. Those radiation-diffusing particles are again embedded in a carrier layer consisting of epoxy resin, silicon or glass.

Such a light-conversion material is connected with certain disadvantages due to the luminescent materials used being embedded in anorganic carrier materials. The granulates used give rise to scattering losses. And non-homogeneous distribution of the granulate on the solid-state emitter may lead to variable color perception as a function of angle. In addition, epoxy resins are instable over time in many respects, especially with respect to their optical and mechanical properties. And as a rule, their thermal stability is also unsatisfactory for generating high brightness. To the extent the respective diffusion materials and luminescence materials are embedded in glass carrier layers, the before-mentioned document does not provide any information how these are to be produced. Moreover, the production and application of a plurality of superimposed layers is complex and expensive.

EP 1 642 869 A1 discloses a glass ceramic which preferably is used for down-conversion of excitation radiation in the blue and UV regions of the spectrum. The glass ceramic comprises the following components (on an oxide basis): 5-50% by weight of $SiO_2$, 5-50% by weight of $Al_2O_3$, 10-80% by weight of $Y_2O_3$, 0-20% by weight of $B_2O_3$, 0.1-30% by weight of rare earths, preferably 15-35% by weight of $SiO_2$, 15-35% by weight of $Al_2O_3$, 25-60% by weight of $Y_2O_3$, 1-15% by weight of $B_2O_3$ and 1-15% by weight of rare earths. The glass ceramic contains crystalline phases in which rare-earth ions are taken up at least in part. Crystalline phases containing yttrium ions as a component are replaced by rear-earth ions in this case at least in part. The phases in question may include, for example, $Y_3Al_5O_{12}$ (YAG), $Y_2SiO_5$, $Y_2Si_2O_7$, $SrAl_2O_4$, $BaMgAl_{10}O_{17}$, $Sr_2P_2O_7$, $Sr_4Al_{14}O_{25}$ and $YbO_3$, that serve as host phase for taking up rare-earth ions at least in part.

The respective glasses are produced by a technological melting process and may then be ceramized. Ceramization is effected by initial tempering at a nucleation temperature of between 850° C. and 900° C., for a period of several hours, and then ceramizing at a temperature of between 1050 to 1150° C. for the time of one hour. The crystal phases identified in this case were $Y_2Si_2O_7$, $Y_2SiO_5$, $YbO_3$.

The conversion efficiency of such glass ceramics is, however, not yet sufficient for many applications because the glass ceramic contains a number of non-convertible crystal phases such as $Y_2Si_2O_7$.

JP(A) H04-119941 further discloses a glass ceramic that contains 5-50% by weight of $SiO_2$, 5-70% by weight of $Al_2O_3$, 10-70% by weight of $Y_2O_3$ and 0.1 to 30% by weight of a nucleation agent such as MgO, $TiO_2$, $ZrO_2$ or $La_2O_3$. For the production process, starting materials (oxides) are mixed with organic solvents and binders, and are heated to then form a shaped glass by solid-state reaction. The glass so produced is then subjected first to a nucleation process, by tempering at temperatures of between 950° C. and 1010° C., and then to ceramization at a temperature of approximately 1100° C.

The production process is relatively complex. And in addition, the glass ceramic has a conversion efficiency not sufficient for all applications.

SUMMARY OF THE INVENTION

In view of this it is a first object of the present invention to provide a method for producing a glass ceramic, whereby particularly advantageous radiation conversion properties can be achieved, in particular for down-conversion of LED radiation.

It is a second object of the present invention to provide a very economical method for producing a glass ceramic.

It is a third object of the present invention to provide a method for producing a glass ceramic which is easily reproducible in order to also permit production at a large technological scale.

It is a forth object of the invention to disclose a glass ceramic having particularly advantageous radiation conversion properties, in particular for down-conversion of LED radiation.

These and other objects are achieved according to the invention by a method for producing glass ceramics comprising the following steps:

Melting a starting glass, comprising (on an oxide basis) 5-50% by weight of $SiO_2$, 5-50% by weight of $Al_2O_3$ and 10-80% by weight of at least one oxide selected from the group formed by $Y_2O_3$, $Lu_2O_3$, $Sc_2O_3$, $Gd_2O_3$, $Yb_2O_3$, $Ce_2O_3$, as well as 0.1-30% by weight of at least one oxide selected from the group formed by $B_2O_3$, $Th_2O_3$, and oxides of the lanthanoids, except $Lu_2O_3$, $Gd_2O_3$, $Yb_2O_3$, $Ce_2O_3$;

heating-up the material for ceramization at a heating rate of at least 10 K/min, preferably using an infrared heating, to a temperature in the range of between 1000° C. to 1400° C., preferably in the range of between 1050° C. to 1300° C., more preferably in the range of 1100° C. to 1250° C., most preferably in the range of 1150° C. to 1250° C., until crystallites are formed that contain a garnet phase; and cooling-down to room temperature.

It has been found according to the invention that when heating up the cooled-down glass in the process of ceramizing a starting glass of usual composition, starting from room temperature, undesirable non-convertible crystal phases (yttrium silicates, for example $Y_2Si_2O_7$ in different isotypes) are formed as a first step and that the desired crystal phases doped with rare earths, for example YAG ($Y_3Al_5O_{12}$), are formed only at a higher temperature. During conventional production of glass ceramics, a homogeneous glass is molten in a first step and is then tempered for an extended period, initially at a lower nucleation temperature and then at a higher ceramizing temperature, in order to thereby achieve controlled crystallization or partial crystallization. It has been found according to the invention that in the conventional production route crystallization of the desired crystal phases is suppressed in part or even prevented altogether when the undesirable yttrium silicates are separated at lower temperature because large parts of the yttrium are then chemically combined. Aluminum silicate phases, which are absolutely unsuited for light conversion (for example mullite: $3Al_2O_3.2SiO_2$) are separated as secondary phases. Further, the doping elements added, such as cerium, are likewise combined in the crystal phases, or are converted into an oxidation stage unsuitable for efficient conversion of the blue light.

The method according to the invention prevents such problems in that the starting glass is heated up for ceramization at a high heating rate of at least 10 K/min, to a temperature in the range of 1000° C. to 1400° C., until crystallites form that contain a garnet phase, and is then cooled down to room temperature. The preferred temperature of 1150° C. to 1250° C., to which the material is first heated up in a short period of time, is approximately 100-200 K, preferably approximately 150 K above the temperature at which the undesirable crystalline phases would form for the first time.

Heating up the material to the temperature suitable for ceramization of the desired garnet phases prevents the formation of the undesirable non-convertible crystal phases. By omitting nucleation at a lower temperature, as usual in the prior art, it is possible in this way to achieve rapid formation of the desired luminescent garnet phases, doped with lanthanoids, and to prevent the formation of undesirable, non-convertible crystal phases. Heating-up is performed preferably homogeneously, which means that the temperature gradients over the sample maximally amount to approximately 10 K.

The invention allows in this way a clearly higher conversion capacity of the glass ceramic produced and, thus, clearly improved conversion efficiency to be achieved.

Although it has been generally known in the art (U.S. Pat. No. 6,843,073 B2) to ceramize lithium-aluminum-silicate starting glasses (LAS glasses) by an infrared heating process at high heating rates, this does not suggest the invention because LAS glass ceramics have a completely different composition and completely different properties than the glass ceramics according to the invention.

According to another embodiment of the invention, ceramization is effected by heating up the material to a first temperature $T_1$, holding that temperature for a first period of time $t_1$ and then cooling down the material to room temperature.

According to another way of carrying out the invention, ceramization is effected by heating up the material to a first temperature $T_1$, holding that temperature for a first period of time $t_1$, cooling down the material to a second temperature $T_2$, holding that temperature for a second period $t_2$ and cooling the material then down to room temperature.

Contrary to conventional ceramization, where nuclei are initially formed at a lower temperature and ceramization is then effected at a higher temperature, the material is thus heated up very rapidly at a high heating rate to a first temperature, is then held at that temperature and cooled down again, or is heated up rapidly to a first higher temperature and is then shortly held at a lower temperature for recrystallizing the desired garnet phases. By controlling the process in that way, the formation of the undesirable non-convertible crystal phases is prevented.

The first temperature $T_1$ may be held approximately for a first period of time $t_1$, which may be in the range of 0 to 30 min, preferably in the range of 0 to 20 min, more preferably in the range of 2 to 20 min, most preferably in the range of 4 to 15 min.

According to a further embodiment the invention, the heating-up rate to the first temperature is at least 20 K/min, preferably at least 50 K/min, preferably at least 100 K/min, preferably at least 200 K/min, more preferably at least 500 K/min, more preferably at least 600 K/min, more preferably at least 1000 K/min, more preferably at least 1200 K/min, most preferably at least 2000 K/min.

By using such a high heating-up rate and a homogeneous heating process, it is largely possible to fully avoid the formation of the undesirable non-convertible crystal phases. Moreover, it is possible to achieve very short process times.

When the starting glass, after having been heated up to the first temperature, is cooled down to the second temperature lower than the first temperature, cooling down to the second temperature is effected preferably by 50 to 200 K, more preferably by 50 to 150 K, most preferably by approximately 100 K.

According to another embodiment of the invention, the second temperature is held for a second period of time $t_2$ in the range of 0 to 30 min, preferably in the range of 1 to 20 min, more preferably in the range of 2 to 15 min, most preferably in the range of 3 to 10 min.

By controlling the process in that way, the formation of the luminescent crystal phases is optimized to guarantee the highest possible light conversion yield.

Temperature treatment is preferably controlled so that during ceramization a crystal phase content of 10 to 95%, more preferably of 20 to 80%, most preferably of 25 to 75%, is obtained in a residual glass phase.

It is possible in this way, by suitably controlling the process, to adjust and optimize the crystal phase content according to the desired application.

The at least one lanthanoid-doped garnet phase is a phase of the type $A_3B_2C_3O_{12}$, wherein:

A as distorted cubes are coordinated locations for large ions;

B are octahedron locations;

C are tetrahedron locations.

When A and C are occupied by trivalent cations (for example by $Y^{3+}$ and by $Al^{3+}$), then location A can be replaced in part by a trivalent lanthanoid cation such as $Ce^{3+}$. Due to the small spacing to the next oxygen atoms, the tetrahedron locations can accommodate a small cation only, such as aluminum or silicon. The octahedron location must in any case be occupied by a trivalent cation.

Although a configuration where A is occupied by a bivalent cation (for example $Ba^{2+}$) and C is occupied by a quadrivalent cation (such as $Si^{4+}$) is likewise imaginable, it is not preferred for that application.

The garnet phases doped with at least one lanthanoid, produced during the ceramization process, may be garnet phases such as $Y_3Al_5O_{12}$ (YAG), $Lu_3Al_5O_{12}$ (LuAG), $Gd_3Al_5O_{12}$ (GdAG), $Yb_3Al_5O_{12}$ (YbAG), $Y_3Sc_2Al_3O_{12}$, $Y_3Sc_2Al_3O_{12}$, $Lu_3Sc_2Al_3O_{12}$, $Gd_3Sc_2Al_3O_{12}$ and $Yb_3Sc_2Al_3O_{12}$. For example, they may be $Ce_{0.09}Y_{2.91}Al_5O_{12}$.

According to another way of carrying out the invention, a garnet phase is produced during ceramization which is doped with at least one element selected from the group formed by the lanthanoids cerium, lanthanum, praseodymium, neodymium, samarium, europium, terbium, dysprosium, holmium, erbium, thulium and thorium.

By doping additionally with further lanthanoids, such as Tm, Tb, Dy, Sm, etc., it is possible to optimize color location, color temperature and the color reproduction index (CRI) and to adapt them to special conversion tasks.

According to a further way of carrying out the invention, a glass ceramic comprising a content of lanthanoids of 0.1 to 20% by weight, preferably 1 to 15% by weight, more preferably 2 to 10% by weight, is produced during ceramization.

The content of lanthanoids in the glass ceramic can be adapted in this way to the desired conversion task in order to achieve the best possible conversion result.

As has been mentioned before, ceramization is carried out preferably by heating up the homogeneous starting glass for ceramization using an infrared heating with very high heating rates. For ceramization, the starting glass preferably is placed on a support that is highly absorbent to IR radiation, such as platinum or quarzal. In addition, highly scattering supports such as $Al_2O_3$, $SiO_2$, preferably in the form of powder, are likewise suitable.

The use of a support in the form of powder can reduce the tendency to stick, as can the use of quartz glass as a support.

Extremely high heating rates can be reached by the use of an infrared heating with a KIR panel heating unit with IR-reflecting walls, for example walls made from quarzal.

Except for incidental contamination, the starting glass used preferably is free from alkali oxides, further from PbO, further free from $TiO_2$, further free from MgO, and preferably free from $ZrO_2$.

Throughout this application, the term "incidental contamination" is understood to be a contamination by a maximum amount of 0.5 percent by weight, or when very pure ingredients are used, by a maximum amount of 0.1 percent by weight, or even by a maximum amount of 0.05 percent by weight.

Further, the starting glass used preferably comprises the following components (in % by weight on an oxide basis):

| | |
|---|---|
| $Y_2O_3$ | 25-60 |
| $SiO_2$ | 10-40 |
| $Al_2O_3$ | 10-40 |
| $B_2O_3$ | 0-20 |
| lanthanoids | 0.1-20. |

It is further preferred to use a starting glass comprising the following components (in % by weight on an oxide basis):

| | |
|---|---|
| $Y_2O_3$ | 30-50 |
| $SiO_2$ | 15-35 |
| $Al_2O_3$ | 15-40 |
| $B_2O_3$ | 0-10 |
| lanthanoids | 1-20. |

According to a further embodiment of the invention, the starting glass does not contain any further components, except for the components explicitly given and except for refining agents and incidental contamination.

Throughout this application, the term "incidental contamination" is understood to be a contamination by a maximum amount of 0.5 percent by weight, or when very pure ingredients are used, by a maximum amount of 0.1 percent by weight, or even by a maximum amount of 0.05 percent by weight.

The lanthanoids preferably may be at least one of the elements cerium or europium, although the other lanthanoids may be used as well and, in addition, small quantities of other lanthanoids may be additionally doped for optimizing color location, color temperature and the color reproduction index.

As has been mentioned before, a glass ceramic produced according to the invention preferably is used as radiation conversion body for converting a first radiation into a radiation with a different energy content or a different spectral distribution, preferably for down-conversion of excitation radiation in the blue and the UV region of the spectrum.

According to another embodiment of the invention, the radiation conversion body is produced in a thickness of 0.01 to 5 mm, preferably 0.02 to 0.5 mm, more preferably 0.05 to 0.5 mm.

This allows conversion over a short length.

According to a further embodiment of the invention, the radiation conversion body is produced in a length of 0.1 to 10 mm, preferably 0.2 to 5 mm, more preferably 0.5 to 2 mm.

Such a geometry allows the body to be suitably adapted to the solid-state transitions of the respective LED chips.

According to a further embodiment of the invention, the radiation conversion body is produced in the form of a disc having a diameter of between 2 and 40 cm, preferably a diameter of between 3 and 30 cm, more preferably a diameter of between 4 and 20 cm.

Further, the radiation conversion body may be produced in the form of a disc having a diameter that conforms to the diameter of the wafer, preferably a wafer of 2 inch, 3 inch, 4 inch, 5 inch or 6 inch in diameter.

It is possible in this way to initially combine the radiation conversion body with a wafer used in the production of LED chips and to then cut it to the respective sizes together with the wafer.

According to a variant of the invention, production of the glass ceramic is carried out as follows:

Melting and homogenizing a starting glass comprising (on an oxide basis) 5-50% by weight of $SiO_2$, 5-50% by weight of $Al_2O_3$ and 10-80% by weight of at least one oxide selected from the group formed by $Y_2O_3$, $Lu_2O_3$, $Sc_2O_3$, $Gd_2O_3$, $Yb_2O_3$, as well as 0.1-30% by weight of at least one oxide selected from the group formed by oxides of the lanthanoids and $B_2O_3$;

controlled cooling down from the molten state to a crystallization temperature in the range of 1000° C. to 1400° C., preferably in the range of 1050° C. to 1300° C., more preferably in the range of 1100° C. to 1250° C., most preferably in the range of 1150° C. to 1250° C., until crystallites form that contain a garnet phase and cooling down to room temperature.

The object of the invention is perfectly achieved in this way as well as the formation of the undesirable crystal phases is avoided and predominantly the desired garnet phase is separated.

Once solidification and crystallization have occurred, the material preferably is cooled down relatively quickly to a temperature slightly above the transformation temperature in order to suppress the formation of the undesirable phases. Using a cooling rate of 50 K/min to 200 K/min it is, for example, possible to cool down the material to a temperature slightly above the transformation temperature $T_g$, preferably to a temperature 5 to 50 K above $T_g$, and to then cool down the material to room temperature in a controlled manner.

At the crystallization temperature, the temperature preferably is held for a period of 0 to 30 min, preferably 1 to 10 min, before cooling-down is permitted to proceed.

It is understood that the features of the invention mentioned above and those yet to be explained below can be used not only in the respective combination indicated, but also in other combinations or in isolation, without leaving the scope of the invention.

BRIEF DESCRIPTION OF THE DRAWINGS

Further features and advantages of the invention will become apparent from the description that follows of a preferred embodiment of the invention, with reference to the drawing. In the drawings.

DETAILED DESCRIPTION OF THE PREFERRED EMBODIMENTS

Table 1 shows a summary of different compositions of starting glasses that may be used for the production of the glass ceramics according to the intention.

The calorimetric glass transformation temperature ($T_g$) is in the range of $830°\,C.<T_g<900°\,C.$, the melting point $T_m$ is in the range of $1210°\,C.<T_m<1400°\,C.$, the diffraction index $n_d$ (at 588 nm) is $1.69<n_d<1.74$, Abbe's coefficient $v_d$ is $50<v_d<55$, and the density $\Delta$ of the glasses is in the range of $3\,g/cm^3<\Delta<4\,g/cm^3$.

TABLE 1

| % by weight | G1 | G2 | G3 | G4 | G5 | G6 | G7 | G8 | G9 |
|---|---|---|---|---|---|---|---|---|---|
| $Y_2O_3$ | 46.4 | 43.7 | 44.88 | 44.88 | 38.5 | 34.14 | 41.9 | 39.6 | 40.4 |
| $SiO_2$ | 23.6 | 22.3 | 28.29 | 28.29 | 21 | 39.02 | 22.85 | 21.6 | 22 |
| $Al_2O_3$ | 20.9 | 31 | 24.39 | 24.39 | 29.6 | 24.39 | 32.25 | 30.4 | 31 |
| $B_2O_3$ | 6.4 | | | | | | | | 0.8 |
| $Eu_2O_3$ | 2.7 | | 2.44 | | | 2.45 | | | |
| $CeO_2$ | | 3 | | 2.44 | 10.9 | | 3 | 8.4 | 5.7 |
| Total | 100 | 100 | 100 | 100 | 100 | 100 | 100 | 100 | 99.9 |

The starting glasses used all are thermodynamically stable, for being produced by a technical glass production process (pot-melting or tank-melting) and for being molded by a technical hot-molding process (drawing, pressing, rolling, tube-drawing and fiber-drawing, floating).

TABLE 2

| | |
|---|---|
| Unit: | KIR-panel heating unit |
| Dimension (w × d × h): | 450 mm × 370 mm × 345 mm (Inner dimensions from wall to wall) |
| Wall material: | quarzal on all sides, Wall thickness: 30 mm |
| Thermal insulation: | None |
| Radiator type:: | Twin tube radiator, 33 × 15 mm² |
| Arrangement of radiators: | Below ceiling surface, in parallel to the width of the unit |
| Number of radiators: | 9 pcs |
| Coils per radiator: | 2 pcs |
| Capacity per coil: | 8.4 kW |
| Color temperature: | 3000 K |

Example 1

Figure 2:
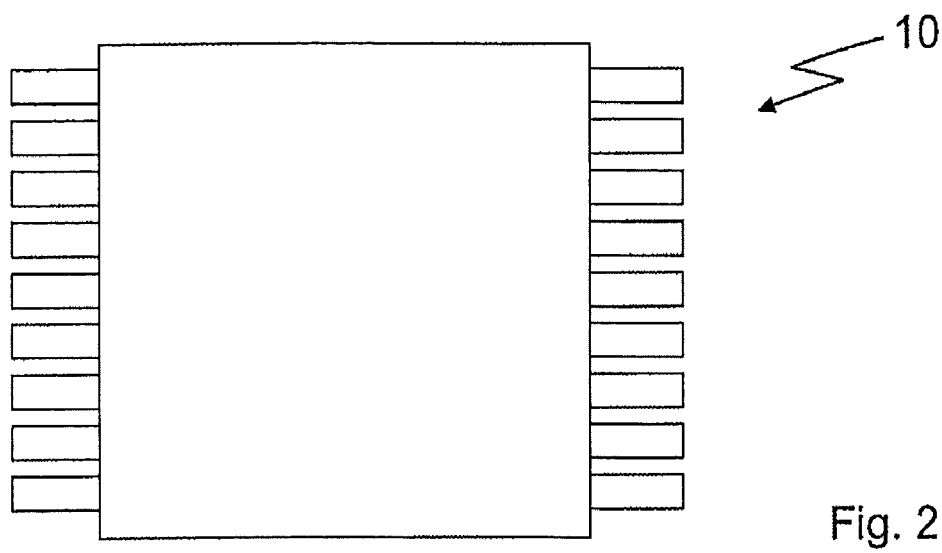
FIG. 2 shows a top view of a KIR heating unit used according to the invention.
Figure 3:
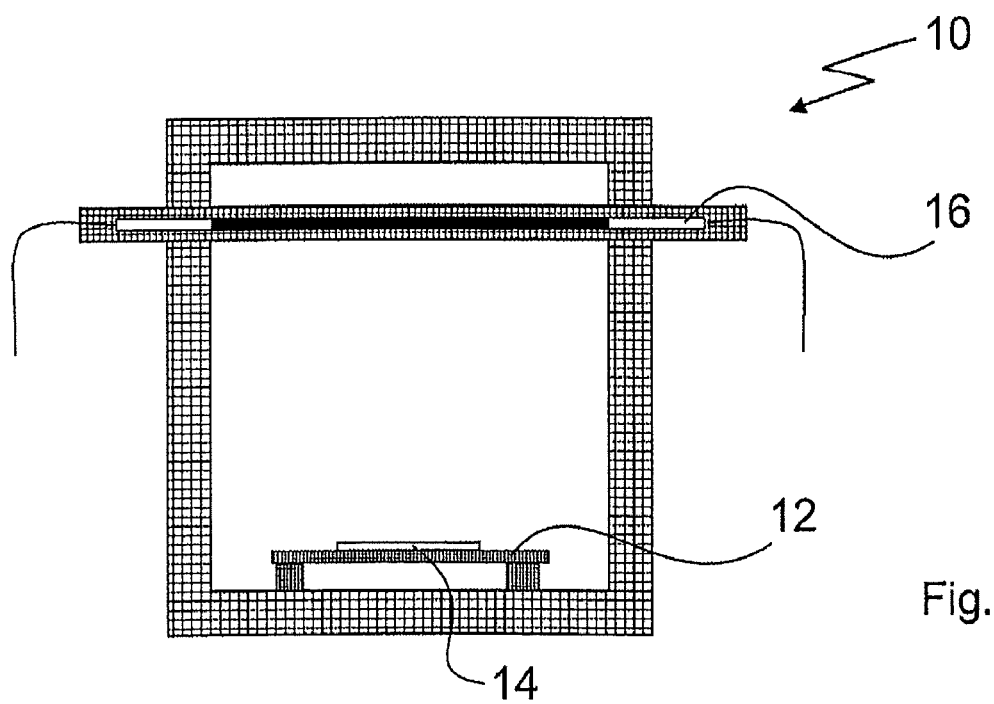
FIG. 3 shows a diagrammatic cross-section through the KIR heating unit illustrated in FIG. 2.

A glass (compare Table 1, starting glass G7) is molten in a platinum melting pot at a temperature of approximately 1450 to 1600° C. and is homogenized. After cooling down to room temperature, a homogeneous, clear, transparent glass is obtained. Samples are cut out from that glass in the form of plates of 60 mm diameter and 0.5 mm thickness, for ceramization. Such glass samples are placed in a KIR panel heating unit, as illustrated diagrammatically in FIGS. 2 and 3, respectively. The KIR panel heating unit (short-wave infrared heating), indicated generally by reference numeral 10 in FIGS. 2 and 3, is heated up using short-wave infrared radiators 16 according to Table 2. The radiators 16 are mounted below the ceiling surface, in parallel to the width of the unit. A suitable support 12 of a highly temperature-stable material, which is highly absorbent or highly scattering to IR radiation, is provided on the bottom of the KIR panel heating unit 10. The material of the support may, for example, be $Al_2O_3$, quartz glass or quarzal, preferably in the form of powder. The samples 14 made from the starting glass, that are to be ceramized, are placed on the support 12.

For ceramization, the material is heated up at a heating rate of 2400 K/min to a target temperature of 1200° C. Following a holding time of 10 min it is cooled down to room temperature by switching off the KIR heating unit 10.

Examples 2-7

Different variants of the heating rates and holding times used, with a second target temperature $T_2$ lower than the first target temperature $T_1$, where applicable, are summarized in Table 3. In all tests, cooling-down to room temperature is effected by switching off the KIR heating unit according to the furnace characteristics (OK).

For all variants, homogeneous glass ceramics are obtained which pre-dominantly contain an lanthanoid-doped YAG phase. The crystallites of the desired YAG phase are homogeneously distributed in a residual glass phase.

TABLE 3

| | Example | | | | | |
|---|---|---|---|---|---|---|
| | 2 | 3 | 4 | 5 | 6 | 7 |
| Starting temperature | RT | RT | RT | RT | RT | RT |
| Heating rate (K/min) | 600 | 1200 | 600 | 200 | 120 | 30 |
| Target temperature $T_1$ [° C.] | 1200 | 1200 | 1200 | 1200 | 1200 | 1200 |
| Holding time $t_1$ [min] at $T_1$ | 8 | 9 | 0 | 0 | 0 | 0 |
| Target temperature $T_2$ [° C.] | — | — | 1100 | 1100 | — | — |
| Holding time $t_2$ [min] at $T_2$ | — | — | 8 | 4 | — | — |
| Cooling-down to room temperature by switching off, according to furnace characteristics (OK) | OK | OK | OK | OK | OK | OK |

Figure 1:
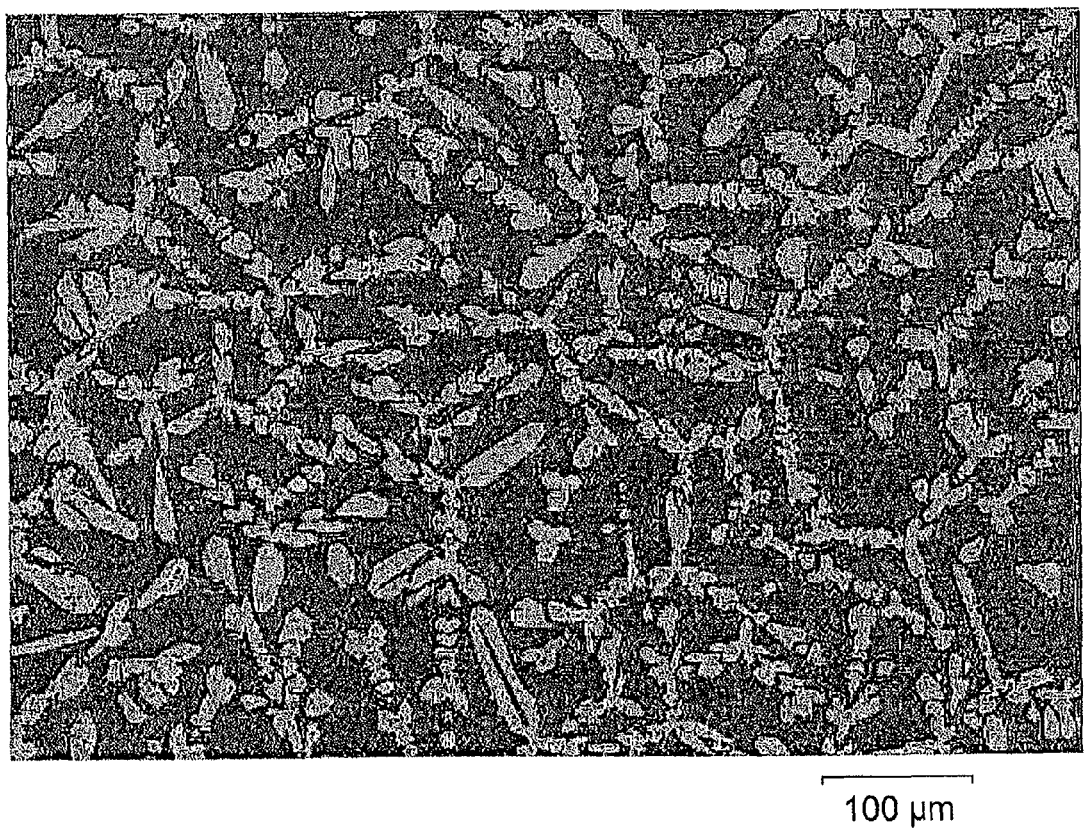
FIG. 1 shows a scanning electron microscope pattern (SEM) of a glass ceramic produced according to the invention.

FIG. 1 shows a SEM pattern of a polished surface of the sample according to example 1 (heating-up rate of 2400 K/min to a target temperature of 1200° C., holding time 10 min). The light areas represent the Ce:YAG crystal phase, while the dark areas represent the residual glass phase. The crystallites of the desired YAG phase are homogeneous and have a size distributed between 1 μm and 500 μm (with an average crystallite size of approximately 10 μm, according to FIG. 1). The percentage of the residual glass phase may be between 1% and 90%, but is preferably between 25% and 75%.

Figure 4:
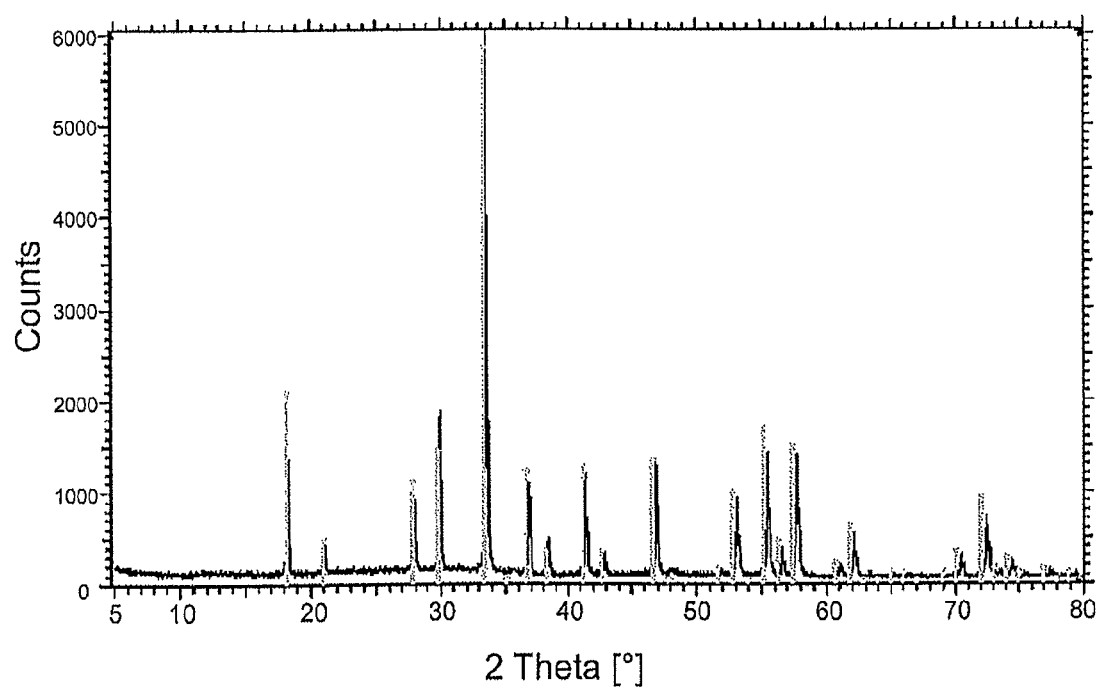
FIG. 4 shows an X-ray diffraction analysis (XRD) of a sample produced according to the invention.

FIG. 4 shows an X-ray diffraction pattern (XRD) of the glass ceramics obtained according to FIG. 1. The crystal phase is a pure YAG with Bragg reflexes that are practically identical to the mono-crystal (light grey line spectrum). Except for small quantities of corundum ($Al_2O_3$) this is the only crystal phase in the system on the surface.

Example 8

A glass (compare Table 1, starting glass G7) is molten in a platinum melting pot at a temperature of approximately 1450 to 1600° C. and is homogenized. The material is then cooled down rapidly at 200 K/min to 1100° C. to 1250° C., for example to approximately 1150° C.; after a holding time of 5 minutes, the material is then cooled down at 200 K/min to approximately 900° C., and then at a cooling rate of approximately 50 K/min to room temperature.

The sample so obtained predominantly contains YAG as a crystal phase.

The invention claimed is:

1. A method for producing a light conversion material, the method comprising producing a glass ceramic for light conversion comprising the steps of
providing a homogeneous starting glass comprising (on an oxide basis) 5-50% by weight of $SiO_2$, 5-50% by weight of $Al_2O_3$ and 10-80% by weight of at least one oxide selected from the group formed by $Y_2O_3$, $Lu_2O_3$, $Sc_2O_3$, $Gd_2O_3$, $Yb_2O_3$, $Ce_2O_3$, as well as 0.1-30% by weight of at least one oxide selected from the group formed by $B_2O_3$, $Th_2O_3$, and oxides of the lanthanoids, except $Lu_2O_3$, $Gd_2O_3$, $Yb_2O_3$, $Ce_2O_3$;
heating-up said starting glass for ceramization at a heating rate of at least 500 K/min to a first temperature $T_1$ in the range of 1000° C. to 1400° C.;
holding said first temperature for a first period of time $t_1$ up to a maximum of 4 minutes;
cooling said starting glass to a second temperature $T_2$ which is 50 to 200 K lower than said first temperature $T_1$;
holding said second temperature $T_2$ for a second period of time $t_2$ up to a maximum of 1 to 20 minutes until crystallites are formed; and
cooling down to room temperature.

2. The method as defined in claim 1, wherein said heating-up is effected by infrared heating.

3. The method as defined in claim 1, wherein said heating-up to said first temperature is effected to a temperature in the range of 1150° C. to 1250° C.

4. The method as defined in claim 1, wherein said starting glass is heated up for ceramization to a first temperature $T_i$ in the range of 1050° C. to 1300° C.

5. The method as defined in claim 1, wherein heating-up to said first temperature is effected at a rate of at least about 1200 K/min.

6. The method as defined in claim 1, wherein the crystallites contain a garnet phase doped with at least one lanthanoid the garnet phase being selected from the group formed by $Y_3Al_5O_{12}$ (YAG), $Lu_3Al_5O_{12}$ (LuAG), $Gd_3Al_5O_{12}$ (GdAG), $Yb_3Al_5O_{12}$ (YbAG), $Y_3Sc_2Al_3O_{12}$, $Y_3Sc_2Al_3O_{12}$, $Lu_3Sc_2Al_3O_{12}$, $Gd_3Sc_2Al_3O_{12}$, and $Yb_3Sc_2Al_3O_{12}$.

7. The method as defined in claim 6, wherein the garnet phase comprises $Y_3Al_5O_{12}$ (YAG).

8. The method as defined in claim 1, wherein the crystallites contain at least one garnet phase which is doped with at least one element selected from the group formed by the lanthanoids cerium, lanthanum, praseodymium, neodymium, samarium, europium, terbium, dysprosium, holmium, erbium, thulium and thorium.

9. The method as defined in claim 1, wherein the crystallites contain a glass ceramic comprising a content of lanthanoids of 0.1 to 20% by weight.

10. The method as defined in claim 1, wherein said starting glass is free from at least one component selected from the group formed by PbO, $TiO_2$, MgO, $ZrO_2$, and alkali oxides, except for incidental contamination.

11. The method as defined in claim 1, wherein said starting glass comprises the following components (in % by weight on an oxide basis):

| | |
|---|---|
| $Y_2O_3$ | 30-50 |
| $SiO_2$ | 15-35 |
| $Al_2O_3$ | 15-40 |

-continued

| | |
|---|---|
| $B_2O_3$ | 0-10 |
| lanthanoids | 1-20. |

12. The method as defined in claim 1, wherein said starting glass comprises no further components, except for refining agents and incidental contamination.

13. The method as defined in claim 1, wherein time $t_2$ is from 1 to 20 minutes.

* * * * *

UNITED STATES PATENT AND TRADEMARK OFFICE
CERTIFICATE OF CORRECTION

PATENT NO. : 7,958,746 B2  
APPLICATION NO. : 11/757609  
DATED : June 14, 2011  
INVENTOR(S) : Karine Seneschal-Merz et al.

It is certified that error appears in the above-identified patent and that said Letters Patent is hereby corrected as shown below:

Title Page, Item (57) ABSTRACT,
Line 6, delete "from the" (second occurrence).

Column 10,
Claim 1, Line 22, delete "1 to".
Claim 4, Line 31, "$T_i$" should be -- $T_1$ --.
Claim 6, Line 37, after "lanthanoid" insert -- , --.

Signed and Sealed this
Eighteenth Day of October, 2011

David J. Kappos
*Director of the United States Patent and Trademark Office*